United States Patent
Huemoeller et al.

(10) Patent No.: US 8,322,030 B1
(45) Date of Patent: Dec. 4, 2012

(54) CIRCUIT-ON-FOIL PROCESS FOR MANUFACTURING A LAMINATED SEMICONDUCTOR PACKAGE SUBSTRATE HAVING EMBEDDED CONDUCTIVE PATTERNS

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

(*) Notice: Subject to any disclaimer, the term of this patent is extended or adjusted under 35 U.S.C. 154(b) by 671 days.

(21) Appl. No.: 11/982,637

(22) Filed: Nov. 1, 2007

Related U.S. Application Data (63) Continuation of application No. 11/166,005, filed on Jun. 24, 2005, now Pat. No. 7,297,562, which is a continuation-in-part of application No. 10/138,225, filed on May 1, 2002, now Pat. No. 6,930,256, and a continuation-in-part of application No. 11/045,402, filed on Jan. 28, 2005, now abandoned.

(51) Int. Cl.
*H05K 3/02* (2006.01)
*H05K 3/36* (2006.01)
*H01K 3/01* (2006.01)

(52) U.S. Cl. ................ 29/846; 29/830; 29/852

(58) Field of Classification Search .............. 29/846, 29/830, 852; 438/15, 22, 25, 50, 51, 52, 438/455, 456
See application file for complete search history.

(56) References Cited

U.S. PATENT DOCUMENTS

| | | | | |
|---|---|---|---|---|
| 3,324,014 A | * | 6/1967 | Modjeska | 205/122 |
| 3,778,900 A | * | 12/1973 | Haining et al. | 29/847 |
| 3,868,724 A | * | 2/1975 | Perrino | 257/668 |
| 3,916,434 A | * | 10/1975 | Garboushian | 257/704 |
| 4,322,778 A | * | 3/1982 | Barbour et al. | 361/794 |
| 4,508,754 A | * | 4/1985 | Stepan | 427/555 |
| 4,532,152 A | * | 7/1985 | Elarde | 216/13 |
| 4,532,419 A | * | 7/1985 | Takeda | 235/492 |
| 4,604,799 A | * | 8/1986 | Gurol | 29/847 |
| 4,642,160 A | * | 2/1987 | Burgess | 216/18 |
| 4,685,033 A | * | 8/1987 | Inoue | 361/794 |
| 4,706,167 A | * | 11/1987 | Sullivan | 361/774 |

(Continued)

FOREIGN PATENT DOCUMENTS

JP 05-109975 4/1993

(Continued)

OTHER PUBLICATIONS

Huemoeller et al., U.S. Appl. No. 12/151,857, filed May 9, 2008, entitled "Multi-Level Circuit Substrate and Fabrication Method".

(Continued)

*Primary Examiner* — David Angwin
(74) *Attorney, Agent, or Firm* — McKay and Hodgson, LLP; Serge J. Hodgson (57) ABSTRACT

A method of making a substrate for a semiconductor package includes providing a laminated layer structure including a backing layer and a metal layer attached to the backing layer. A circuit layer is plated atop a first surface of the metal layer to form a circuit-on-metal structure. The circuit-on-metal structure is coupled to a dielectric layer by causing the dielectric layer to flow around the circuit layer to the first surface of the metal layer so that the circuit layer is embedded within the dielectric layer and the first surface of the metal layer is in direct contact with a first surface of the dielectric layer. The backing layer is then removed completely. The metal layer is then removed completely.

33 Claims, 7 Drawing Sheets

U.S. PATENT DOCUMENTS

| | | | | |
|---|---|---|---|---|
| 4,716,049 A * | 12/1987 | Patraw | | 216/18 |
| 4,786,952 A * | 11/1988 | MacIver et al. | | 257/260 |
| 4,806,188 A * | 2/1989 | Rellick | | 156/89.16 |
| 4,811,082 A * | 3/1989 | Jacobs et al. | | 257/700 |
| 4,897,338 A * | 1/1990 | Spicciati et al. | | 430/314 |
| 4,905,124 A * | 2/1990 | Banjo et al. | | 361/737 |
| 4,915,983 A * | 4/1990 | Lake et al. | | 430/314 |
| 4,964,212 A * | 10/1990 | Deroux-Dauphin et al. | | 29/852 |
| 4,974,120 A * | 11/1990 | Kodai et al. | | 361/737 |
| 4,996,391 A * | 2/1991 | Schmidt | | 174/255 |
| 5,021,047 A * | 6/1991 | Movern | | 604/110 |
| 5,053,357 A * | 10/1991 | Lin et al. | | 29/593 |
| 5,072,075 A * | 12/1991 | Lee et al. | | 174/264 |
| 5,081,520 A * | 1/1992 | Yoshii et al. | | 257/702 |
| 5,108,553 A * | 4/1992 | Foster et al. | | 205/125 |
| 5,110,664 A * | 5/1992 | Nakanishi et al. | | 428/195.1 |
| 5,191,174 A * | 3/1993 | Chang et al. | | 174/266 |
| 5,229,550 A * | 7/1993 | Bindra et al. | | 174/262 |
| 5,239,448 A * | 8/1993 | Perkins et al. | | 361/764 |
| 5,247,429 A * | 9/1993 | Iwase et al. | | 362/29 |
| 5,263,243 A | 11/1993 | Taneda et al. | | 29/830 |
| 5,283,459 A * | 2/1994 | Hirano et al. | | 257/419 |
| 5,293,243 A * | 3/1994 | Degnan et al. | | 348/369 |
| 5,371,654 A * | 12/1994 | Beaman et al. | | 361/744 |
| 5,379,191 A * | 1/1995 | Carey et al. | | 361/777 |
| 5,404,044 A * | 4/1995 | Booth et al. | | 257/698 |
| 5,440,805 A * | 8/1995 | Daigle et al. | | 29/830 |
| 5,463,253 A * | 10/1995 | Waki et al. | | 257/724 |
| 5,474,957 A * | 12/1995 | Urushima | | 29/827 |
| 5,474,958 A * | 12/1995 | Djennas et al. | | 29/827 |
| 5,508,938 A * | 4/1996 | Wheeler | | 716/112 |
| 5,530,288 A * | 6/1996 | Stone | | 257/700 |
| 5,531,020 A * | 7/1996 | Durand et al. | | 29/840 |
| 5,574,309 A * | 11/1996 | Papapietro et al. | | 257/679 |
| 5,581,498 A * | 12/1996 | Ludwig et al. | | 365/63 |
| 5,582,858 A * | 12/1996 | Adamopoulos et al. | | 156/281 |
| 5,616,422 A * | 4/1997 | Ballard et al. | | 428/621 |
| 5,637,832 A * | 6/1997 | Danner | | 174/260 |
| 5,674,785 A * | 10/1997 | Akram et al. | | 438/15 |
| 5,719,749 A * | 2/1998 | Stopperan | | 361/769 |
| 5,739,579 A * | 4/1998 | Chiang et al. | | 257/635 |
| 5,739,581 A * | 4/1998 | Chillara et al. | | 257/668 |
| 5,739,585 A * | 4/1998 | Akram et al. | | 257/698 |
| 5,739,588 A * | 4/1998 | Ishida et al. | | 257/782 |
| 5,742,479 A * | 4/1998 | Asakura | | 361/737 |
| 5,774,340 A * | 6/1998 | Chang et al. | | 361/771 |
| 5,784,259 A * | 7/1998 | Asakura | | 361/752 |
| 5,798,014 A * | 8/1998 | Weber | | 156/263 |
| 5,822,190 A * | 10/1998 | Iwasaki | | 361/737 |
| 5,826,330 A * | 10/1998 | Isoda et al. | | 29/852 |
| 5,835,355 A * | 11/1998 | Dordi | | 361/760 |
| 5,847,453 A * | 12/1998 | Uematsu et al. | | 257/728 |
| 5,894,108 A * | 4/1999 | Mostafazadeh et al. | | 174/529 |
| 5,903,052 A * | 5/1999 | Chen et al. | | 257/706 |
| 5,936,843 A * | 8/1999 | Ohshima et al. | | 361/760 |
| 5,952,611 A * | 9/1999 | Eng et al. | | 174/534 |
| 5,990,546 A * | 11/1999 | Igarashi et al. | | 257/700 |
| 6,004,619 A * | 12/1999 | Dippon et al. | | 29/852 |
| 6,013,948 A * | 1/2000 | Akram et al. | | 257/698 |
| 6,021,564 A * | 2/2000 | Hanson | | 29/852 |
| 6,028,364 A * | 2/2000 | Ogino et al. | | 257/778 |
| 6,034,427 A * | 3/2000 | Lan et al. | | 257/698 |
| 6,035,527 A | 3/2000 | Tamm | | |
| 6,039,889 A | 3/2000 | Zhang et al. | | |
| 6,040,622 A * | 3/2000 | Wallace | | 257/679 |
| 6,060,778 A * | 5/2000 | Jeong et al. | | 257/710 |
| 6,069,407 A * | 5/2000 | Hamzehdoost | | 257/774 |
| 6,072,243 A * | 6/2000 | Nakanishi | | 257/783 |
| 6,081,036 A * | 6/2000 | Hirano et al. | | 257/773 |
| 6,115,910 A * | 9/2000 | Ghahghahi | | 29/833 |
| 6,119,338 A * | 9/2000 | Wang et al. | | 29/852 |
| 6,122,171 A * | 9/2000 | Akram et al. | | 361/749 |
| 6,127,250 A * | 10/2000 | Sylvester et al. | | 438/584 |
| 6,127,833 A * | 10/2000 | Wu et al. | | 324/756.02 |
| 6,160,705 A * | 12/2000 | Stearns et al. | | 361/704 |
| 6,162,365 A * | 12/2000 | Bhatt et al. | | 216/13 |
| 6,172,419 B1 * | 1/2001 | Kinsman | | 257/737 |
| 6,175,087 B1 * | 1/2001 | Keesler et al. | | 174/261 |
| 6,184,463 B1 * | 2/2001 | Panchou et al. | | 174/558 |
| 6,194,250 B1 * | 2/2001 | Melton et al. | | 438/126 |
| 6,204,453 B1 * | 3/2001 | Fallon et al. | | 174/255 |
| 6,214,641 B1 * | 4/2001 | Akram | | 438/107 |
| 6,235,554 B1 * | 5/2001 | Akram et al. | | 438/109 |
| 6,239,485 B1 * | 5/2001 | Peters et al. | | 257/700 |
| D445,096 S | 7/2001 | Wallace | | D14/117 |
| D446,525 S | 8/2001 | Okamoto et al. | | D14/436 |
| 6,274,821 B1 * | 8/2001 | Echigo et al. | | 174/255 |
| 6,280,641 B1 * | 8/2001 | Gaku et al. | | 216/17 |
| 6,316,285 B1 * | 11/2001 | Jiang et al. | | 438/106 |
| 6,351,031 B1 * | 2/2002 | Iijima et al. | | 257/698 |
| 6,352,914 B2 | 3/2002 | Ball et al. | | 438/599 |
| 6,353,999 B1 * | 3/2002 | Cheng | | 29/852 |
| 6,365,975 B1 * | 4/2002 | DiStefano et al. | | 257/777 |
| 6,368,967 B1 * | 4/2002 | Besser | | 438/687 |
| 6,376,906 B1 * | 4/2002 | Asai et al. | | 257/698 |
| 6,378,201 B1 * | 4/2002 | Tsukada et al. | | 29/852 |
| 6,392,160 B1 * | 5/2002 | Andry et al. | | 174/261 |
| 6,395,578 B1 * | 5/2002 | Shin et al. | | 438/106 |
| 6,405,431 B1 * | 6/2002 | Shin et al. | | 29/852 |
| 6,406,942 B2 * | 6/2002 | Honda | | 438/119 |
| 6,407,341 B1 * | 6/2002 | Anstrom et al. | | 174/255 |
| 6,407,930 B1 * | 6/2002 | Hsu | | 361/784 |
| 6,418,615 B1 * | 7/2002 | Rokugawa et al. | | 29/852 |
| 6,426,550 B2 * | 7/2002 | Ball et al. | | 257/700 |
| 6,451,509 B2 * | 9/2002 | Keesler et al. | | 430/311 |
| 6,472,306 B1 * | 10/2002 | Lee et al. | | 438/623 |
| 6,479,762 B2 * | 11/2002 | Kusaka | | 174/261 |
| 6,497,943 B1 * | 12/2002 | Jimarez et al. | | 428/209 |
| 6,502,774 B1 * | 1/2003 | Johansson et al. | | 241/37 |
| 6,517,995 B1 * | 2/2003 | Jacobson et al. | | 430/320 |
| 6,528,874 B1 * | 3/2003 | Iijima et al. | | 257/700 |
| 6,534,391 B1 * | 3/2003 | Huemoeller et al. | | 438/612 |
| 6,534,723 B1 * | 3/2003 | Asai et al. | | 174/255 |
| 6,544,638 B2 * | 4/2003 | Fischer et al. | | 428/322.7 |
| 6,570,258 B2 * | 5/2003 | Ma et al. | | 257/774 |
| 6,574,106 B2 * | 6/2003 | Mori | | 361/705 |
| 6,586,682 B2 * | 7/2003 | Strandberg | | 174/255 |
| 6,608,757 B1 * | 8/2003 | Bhatt et al. | | 361/748 |
| 6,637,105 B1 * | 10/2003 | Watanabe et al. | | 29/852 |
| 6,660,559 B1 * | 12/2003 | Huemoeller et al. | | 438/106 |
| 6,715,204 B1 * | 4/2004 | Tsukada et al. | | 29/847 |
| 6,727,645 B2 * | 4/2004 | Tsujimura et al. | | 313/504 |
| 6,730,857 B2 * | 5/2004 | Konrad et al. | | 174/257 |
| 6,740,964 B2 * | 5/2004 | Sasaki | | 257/687 |
| 6,753,612 B2 * | 6/2004 | Adae-Amoakoh et al. | | 257/774 |
| 6,787,443 B1 * | 9/2004 | Boggs et al. | | 438/612 |
| 6,803,528 B1 * | 10/2004 | Koyanagi | | 174/262 |
| 6,804,881 B1 * | 10/2004 | Shipley et al. | | 29/830 |
| 6,815,709 B2 * | 11/2004 | Clothier et al. | | 257/40 |
| 6,815,739 B2 * | 11/2004 | Huff et al. | | 257/275 |
| 6,822,334 B2 * | 11/2004 | Hori et al. | | 257/775 |
| 6,891,261 B2 * | 5/2005 | Awaya | | 257/692 |
| 6,908,863 B2 | 6/2005 | Barns et al. | | |
| 6,913,952 B2 * | 7/2005 | Moxham et al. | | 438/125 |
| 6,919,514 B2 * | 7/2005 | Konrad et al. | | 174/258 |
| 6,930,256 B1 * | 8/2005 | Huemoeller et al. | | 174/260 |
| 6,930,257 B1 * | 8/2005 | Hiner et al. | | 174/262 |
| 6,940,170 B2 * | 9/2005 | Parikh | | 257/750 |
| 6,989,593 B2 * | 1/2006 | Khan et al. | | 257/707 |
| 6,998,335 B2 * | 2/2006 | Fan et al. | | 438/612 |
| 7,028,400 B1 * | 4/2006 | Hiner et al. | | 29/852 |
| 7,033,928 B2 * | 4/2006 | Kawano | | 438/637 |
| 7,061,095 B2 | 6/2006 | Boggs et al. | | |
| 7,145,238 B1 * | 12/2006 | Huemoeller et al. | | 257/750 |
| 7,214,609 B2 * | 5/2007 | Jiang et al. | | 438/637 |
| 7,242,081 B1 * | 7/2007 | Lee | | 257/686 |
| 7,292,056 B2 * | 11/2007 | Matsuda | | 324/754.07 |
| 7,297,562 B1 * | 11/2007 | Huemoeller et al. | | 438/15 |
| 7,345,361 B2 * | 3/2008 | Mallik et al. | | 257/686 |
| 7,372,151 B1 * | 5/2008 | Fan et al. | | 257/738 |
| 7,435,352 B2 * | 10/2008 | Mok et al. | | 216/13 |
| 2001/0041436 A1 * | 11/2001 | Parikh | | 438/600 |
| 2002/0017712 A1 * | 2/2002 | Bessho et al. | | 257/700 |
| 2002/0140105 A1 * | 10/2002 | Higgins et al. | | 257/774 |
| 2003/0000738 A1 * | 1/2003 | Rumsey et al. | | 174/260 |
| 2003/0128096 A1 * | 7/2003 | Mazzochette | | 338/22 R |
| 2005/0194353 A1 * | 9/2005 | Johnson et al. | | 216/65 |

| 2005/0205295 | A1 | 9/2005 | Tsuk |
| 2006/0157854 | A1 | 7/2006 | Takewaki et al. |
| 2006/0197228 | A1* | 9/2006 | Daubenspeck et al. ....... 257/773 |
| 2007/0114203 | A1 | 5/2007 | Kang |
| 2007/0273049 | A1 | 11/2007 | Khan et al. |
| 2007/0290376 | A1 | 12/2007 | Zhao et al. |
| 2008/0230887 | A1 | 9/2008 | Sun et al. |

FOREIGN PATENT DOCUMENTS

| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Huemoeller et al., "Semiconductor Package Having Laser-Embedded Terminals", U.S. Appl. No. 11/182,985, filed Jul. 14, 2005.

Huemoeller et al., "Integral Plated Semiconductor Package Substrate Stiffener", U.S. Appl. No. 11/189,593, filed Jul. 26, 2005.

Hiner et al., "Extended Landing Pad Substrate Package Structure and Method", U.S. Appl. No. 12/351,596, filed Jan. 9, 2009.

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

Huemoeller et al., "Method and Structure for Creating Embedded Metal Features", U.S. Appl. No. 12/462,665, filed Aug. 5, 2009.

Huemoeller et al., "Thin Substrate Fabrication Method and Structure", U.S. Appl. No. 11/953,680, filed Dec. 10, 2007.

IBM Technical Disclosure Bulletin, "Microstructure Solder Mask by Means of a Laser", vol. 36, Issue 11, p. 589, Nov. 1, 1993. (NN9311589).

Wolf et al., "Silicon Processing for the VLSI Era: vol. 1—Process Technology", 1986, pp. 407-408.

Huemoeller et al., U.S. Appl. No. 10/947,124, filed Sep. 22, 2004, entitled "Method for Making an Integrated Circuit Substrate Having Embedded Back-Side Access Conductors and Vias".

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Hiner et al., U.S. Appl. No. 11/098,995, filed Apr. 5, 2005, entitled "Method for Making an Integrated Circuit Substrate Having Laminated Laser-Embedded Circuit Layers".

Huemoeller et al., U.S. Appl. No. 11/527,827, filed Sep. 26, 2006, entitled "Semiconductor Package and Substrate Having Multi-Level Vias Fabrication Method".

Huemoeller et al., U.S. Appl. No. 11/543,540, filed Oct. 4, 2006, entitled "Method and Structure for Creating Embedded Metal Features".

Rusli et al., U.S. Appl. No. 11/621,402, filed Jan. 9, 2007, entitled "Embedded Circuit Pattern Fabrication Method and Structure".

Huemoeller et al., U.S. Appl. No. 11/903,002, filed Sep. 19, 2007, entitled "Substrate Having Stiffener Fabrication Method".

* cited by examiner

CIRCUIT-ON-FOIL PROCESS FOR MANUFACTURING A LAMINATED SEMICONDUCTOR PACKAGE SUBSTRATE HAVING EMBEDDED CONDUCTIVE PATTERNS

CROSS-REFERENCE TO RELATED APPLICATIONS

The present application is a continuation of U.S. patent application entitled "CIRCUIT-ON-FOIL PROCESS FOR MANUFACTURING A LAMINATED SEMICONDUCTOR PACKAGE SUBSTRATE HAVING EMBEDDED CONDUCTIVE PATTERNS", Ser. No. 11/166,005, filed Jun. 24, 2005, now U.S. Pat. No. 7,297,562, issued Nov. 20, 2007, which is a continuation-in-part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, now U.S. Pat. No. 6,930,256, issued Aug. 16, 2005, and is also a continuation-in-part of U.S. patent application entitled "SEMICONDUCTOR PACKAGE SUBSTRATE HAVING A PRINTED CIRCUIT PATTERN ATOP AND WITHIN A DIELECTRIC AND A METHOD FOR MAKING A SUBSTRATE", Ser. No. 11/045,402 filed Jan. 28, 2005, now abandoned, which is a continuation-in-part of U.S. patent application Ser. No. 10/138,225 filed May 1, 2002, now U.S. Pat. No. 6,930,256, issued Aug. 16, 2005, entitled "INTEGRATED CIRCUIT SUBSTRATE HAVING LASER-EMBEDDED CONDUCTIVE PATTERNS AND METHOD THEREFOR."

All of the above-referenced U.S. patent applications have at least one common inventor and are assigned to the same assignee as this application. The specifications of the above-referenced patent applications are herein incorporated by reference.

FIELD OF THE INVENTION

The present invention relates generally to semiconductor packaging, and more specifically, to a laminated substrate having embedded conductive patterns for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. The above-incorporated patent applications disclose substrates and processes for making substrates having embedded conductors.

However, the embossing process described in the above-incorporated parent applications requires special tooling and has limitations on conductor size that are related to the material used for the dielectric. The laser-ablation processes described in the above-incorporated parent applications require a very high power laser in order to ablate the dielectric material and have consequent speed limitations that lower throughput. The ablation of the dielectric material also limits the possible conductor density because of the difficulties associated with cleanly ablating the dielectric material.

Therefore, it would be desirable to provide an embedded-conductor substrate manufacturing process having improved conductor density, manufacturing throughput and a low associated manufacturing cost. It would further be desirable to provide such a process that does not require a high power laser.

SUMMARY OF THE INVENTION

A semiconductor package substrate having embedded conductive patterns and a process for making the substrate generate channels that contain a circuit pattern beneath the surface of a substrate. The substrate is made by laminating a special metal layer into and onto a dielectric layer. The special metal layer includes at least two metal sub-layers: a substantially planar metal foil and a circuit pattern built-up on the film. After one or two circuit-on-film metal layers are bonded onto one or both sides of the dielectric layer, the metal layer is stripped down to the surface of the dielectric layer, leaving a circuit layer embedded within one or both sides of the substrate.

Vias can then be formed between multiple layers by laser ablating holes and filling them with metal.

The circuit-on-foil layer can be made by using a plating resist material that is then laser-ablated, yielding a negative circuit image. The regions between the ablated resist are filled by plating up metal and the resist is removed to yield a circuit-on-foil structure. Alternatively, the circuit-on-foil layer can be made by using a photo-sensitive plating resist material that is then laser-exposed and the exposed material is then removed and plated as described above. (The resist material can also be a negative photo-sensitive resist material in which case a positive circuit image is used.)

The foil that is used to make the circuit-on-foil layer can be a releasable foil having a copper backer layer such as those currently used for making laminated circuit board metal layers above the circuit board surface, or may be made by laminating or plating copper on a stainless steel plate to form a copper carrier layer.

The vias between layers can either be made by drilling from one side of the substrate through the embedded circuit to the embedded circuit on the opposite side, or may be made by drilling completely through the substrate. The holes are then filled with material. If one side of a double-sided assembly is left with metal film remaining above the surface of the dielectric, then the vias can be plated to that side via an electroplating process with the remaining metal film as an electrode. Subsequently, the metal film can be removed, leaving embedded circuits on each side of the substrate, with plated vias between the layers.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The present invention concerns a process for making a semiconductor package substrate having a very thin structure. A foil is used to provide a carrier for a thin metal circuit layer that is built up on the foil and then embedded in a dielectric layer. The foil is removed subsequent to embedding the circuit layer leaving a dielectric layer with embedded circuits that reduce migration and manufacturing defect shorts between adjacent circuit features and reduce the overall height of the substrate. The foil can be a thin metal layer plated or gilded on to a stainless steel surface, as in the process well known for forming films for lamination onto printed wiring boards prior to etch formation of a circuit pattern. An alternative foil that can be used is a laminated foil/metal backing layer structure such as MICROTHIN foil produced by Oak-Mitsui division of Mitsui Kinzoku Group. MICROTHIN foil is first laminated to a supporting dielectric structure with the thin foil layer to which a circuit is to be added on the outside and the backing layer (carrier foil) laminated to the supporting dielectric structure. The circuit pattern is plated up on the laminate structure, the circuit pattern side of the laminate is embedded in a dielectric layer and then the metal backing layer and supporting dielectric are removed.

A novel process for forming the circuit pattern is also presented and can be used in the process mentioned above. The circuit pattern formation process uses a laser to ablate a plating resist material rather than ablating material of the dielectric layer or displacing the dielectric material by embossing, as is performed in the above-incorporated parent U.S. patent applications. The process of resist ablation can be extended to etching resist materials and can be used for formation of larger-thickness circuits such as printed wiring boards in addition to the formation of very thin semiconductor package substrates.

Referring now to the figures and in particular to FIGS. 1A-1F, cross-sectional views illustrate a substrate manufacturing process in accordance with an embodiment of the present invention. A circuit-on-foil structure is used to form a very thin semiconductor package substrate in a novel process that permits embedding circuits beneath the top and/or bottom surface of a substrate.

Figure 1A:
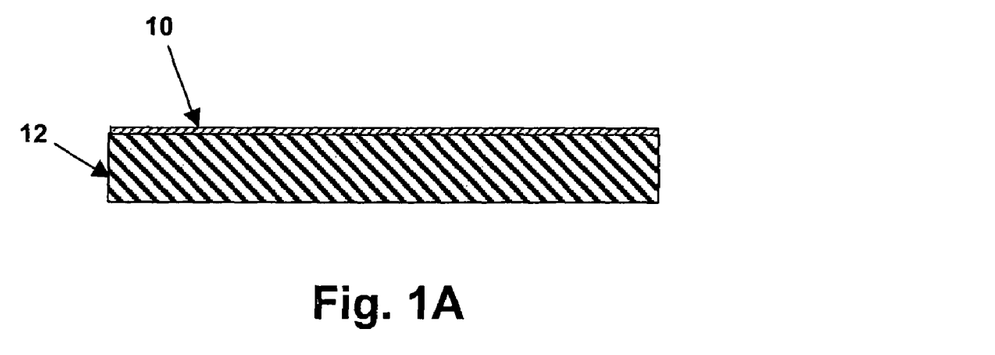
FIGS. 1A-1F are pictorial diagrams depicting cross-sectional views of various stages in the preparation of a substrate in accordance with an embodiment of the present invention.

FIG. 1A shows a metal film layer 10, which is generally copper, but may be another plating-compatible material, bonded temporarily to a stainless steel tool plate 12. It should be understood that other materials may be used for plate 12, provided that the strength of the attachment between metal film layer 10 and plate 12 is sufficiently strong to retain metal film layer 10 on plate 12 during processing, but permitting release of metal film layer once bonding of the film layer to a dielectric layer has been accomplished as illustrated below.

Figure 1B:
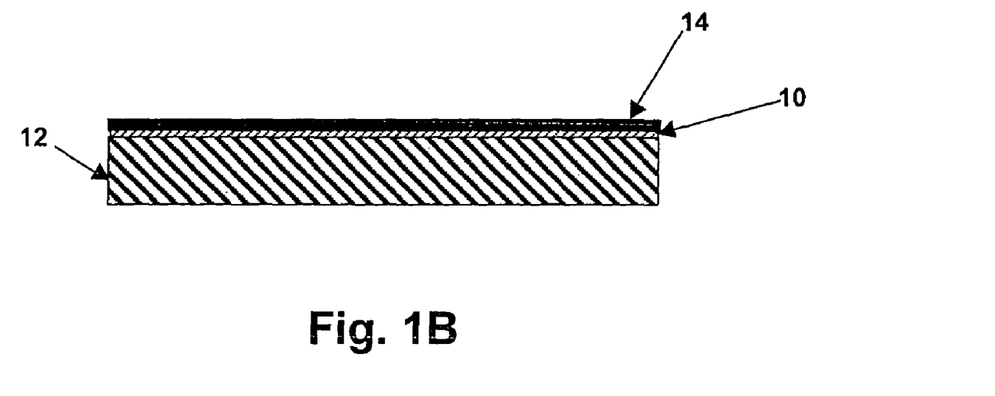
Figure 1C:
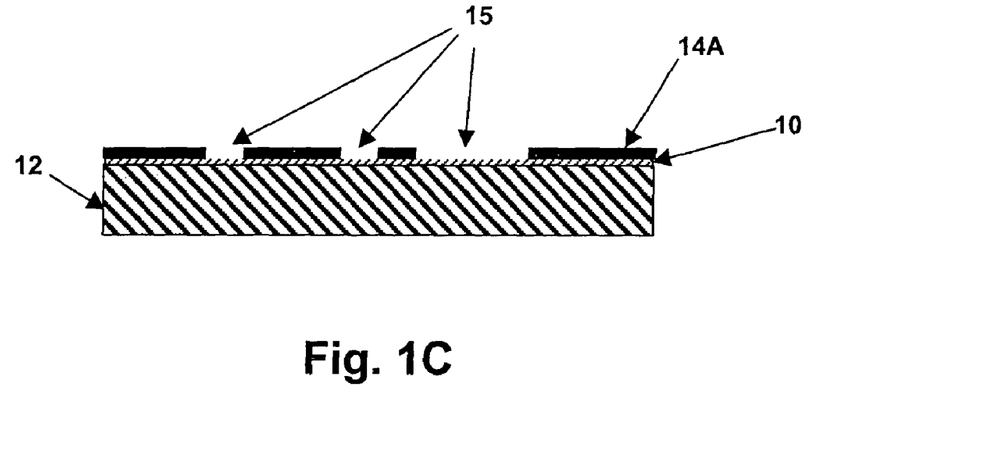

FIG. 1B shows metal film layer 10 after a plating resist material 14 has been applied over the outer surface of metal film layer 10 and FIG. 1C illustrates the patterned plating resist material 14A after ablation by an excimer laser that removes the plating resist material in regions 15 where a circuit pattern is to be formed atop metal film layer 10. Alternatively, a photographic process can be used to form resist pattern 14A as is used in traditional circuit processing where a photosensitive resist material 14 is applied and exposed using a mask and uniform illumination source or a scanning laser to expose resist material 14. Then the photosensitive resist material is processed to remove the material not forming part of pattern 14A.

Figure 1D:
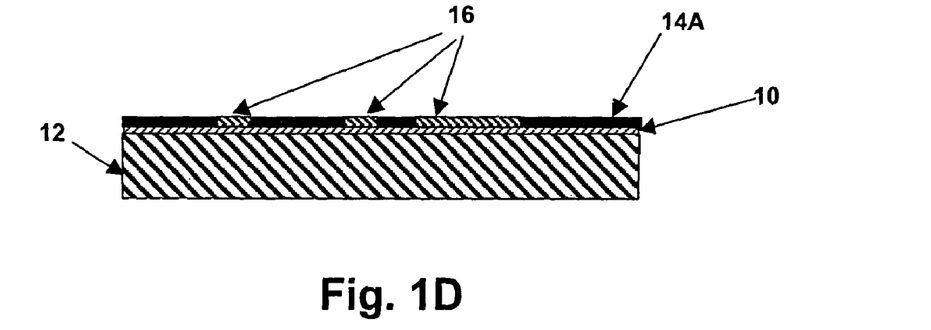
Figure 1E:
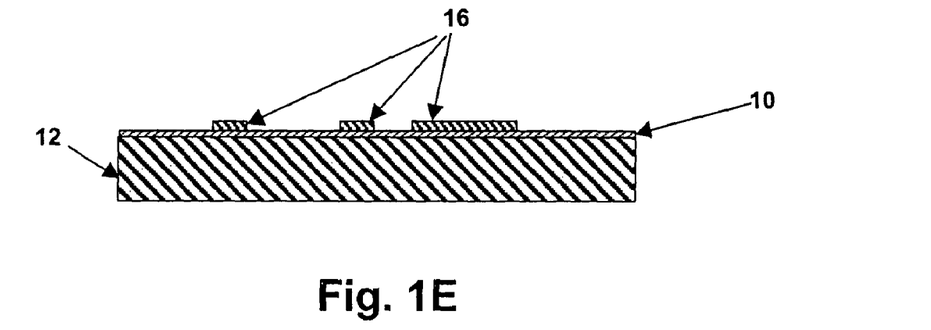

After patterning, as shown in FIG. 1D, metal is plated in circuit pattern regions 15 defined by resist pattern 14A to form circuit pattern 16 and then the remaining resist pattern 14A material is removed by machining or a chemical process, leaving a circuit-on-foil structure mounted atop tool plate 12 as shown in FIG. 1E.

Figure 1F:
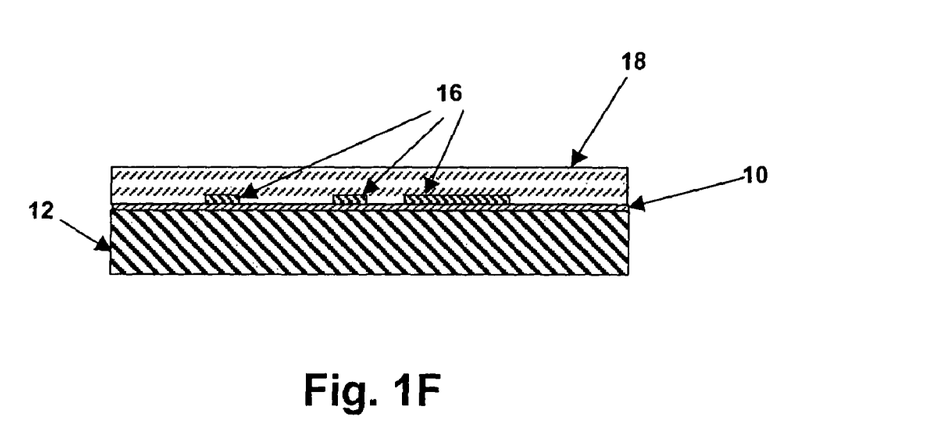

The semiconductor substrate of the present invention is then formed by bonding the circuit-on-foil structure to a dielectric layer 18 so that the circuit pattern 16 is embedded within dielectric layer 18 as shown in FIG. 1F. The bonding may be performed by pressing the circuit-on-foil structure to a flowable dielectric such as a prepreg material and then UV-curing or otherwise fixing the material forming dielectric layer 18, or alternatively by molding a curable, time-curing or molten dielectric material atop the circuit-on-foil structure.

Figure 2A:
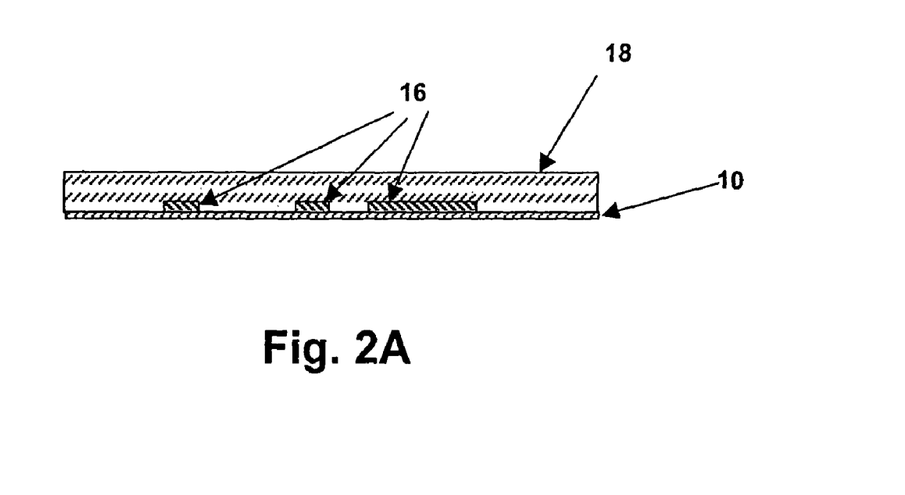
FIGS. 2A-2F are pictorial diagrams depicting cross-sectional views of various further stages of preparation of a substrate in accordance with an embodiment of the present invention.
Figure 2B:
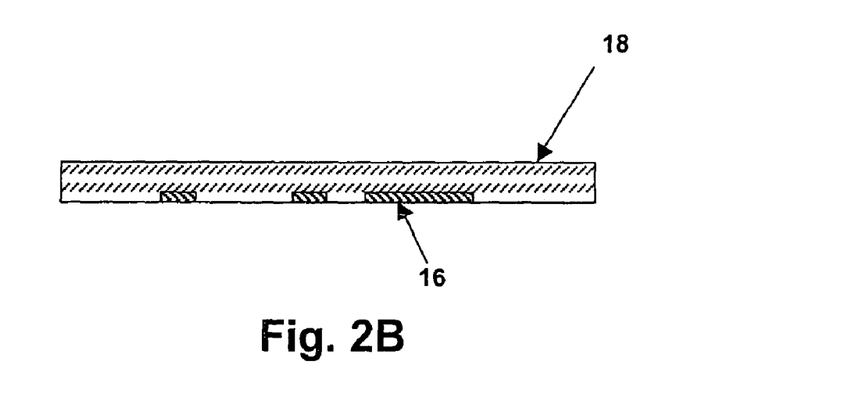

After the circuit-on-foil structure has been bonded to dielectric layer 18, further processing steps are applied as illustrated in FIGS. 2A-2F. First, as illustrated in FIG. 2A, the fabricated substrate is detached from tool plate 12, and then metal foil 10 is removed by machining or etching, to yield a single-sided substrate as shown in FIG. 2B.

Figure 2C:
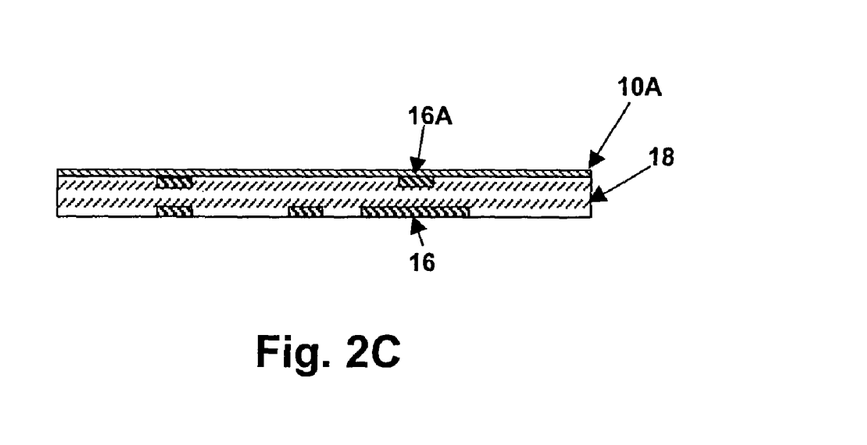

The processing steps illustrated in FIGS. 1B-1F can be repeated to form a second circuit-on-film structure having a circuit pattern 16A for forming the opposite side of a semiconductor package substrate, and then bonding the second circuit-on-film structure to the side of dielectric layer 18 opposing circuit pattern 16 to form a double-sided substrate as illustrated in FIG. 2C, in which a metal film layer 10A is left in place temporarily.

Figure 2D:
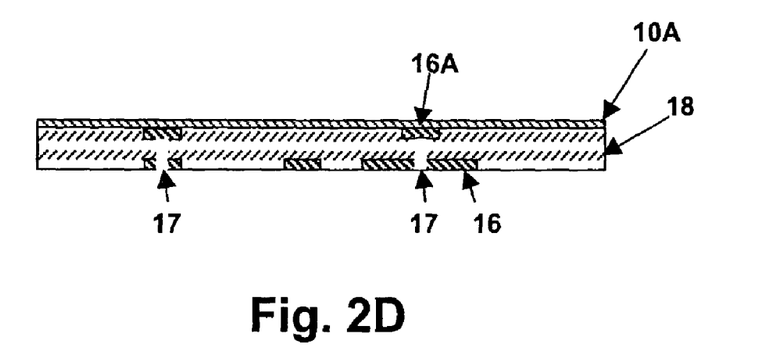
Figure 2E:
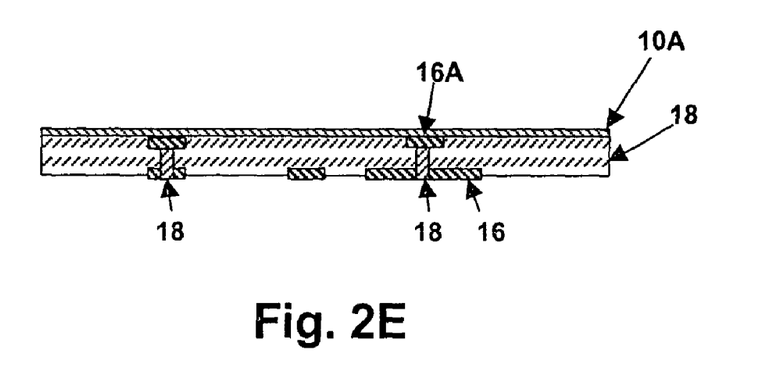
Figure 2F:
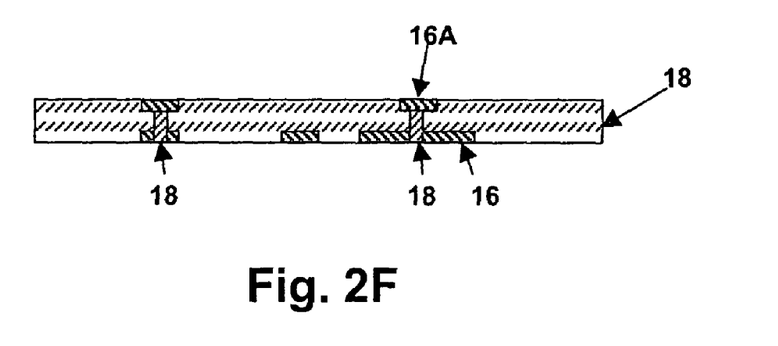

Via holes 17 may be laser-drilled or machined in dielectric layer 18 through circuit pattern 16 to the bottom side of circuit pattern 16A as shown in FIG. 2D and then filled with metal paste or plated to form vias 18 that provide electrical connections between circuit pattern 16 and circuit pattern 16A as shown in FIG. 2E. Metal layer 10A is left in place if a plating process is used and then removed as shown in FIG. 2F, so that a common electrode for plating vias 18 is easily available. If a paste process is used, metal layer can be removed prior to paste processing or laser-drilling of via holes 17.

FIG. 2F shows the completed semiconductor package substrate as formed by the above-described process. The feature sizes accomplished in the illustrated substrate are less than 10 microns wide and the thickness of the circuit patterns may be less than five microns, yielding a very thin substrate.

Figure 3A:
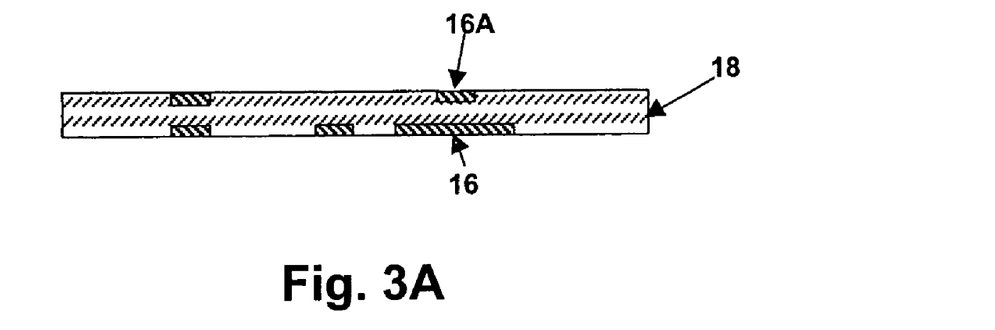
FIGS. 3A-3C are pictorial diagrams depicting cross-sectional views of various further stages of preparation of a substrate in accordance with another embodiment of the present invention.
Figure 3B:
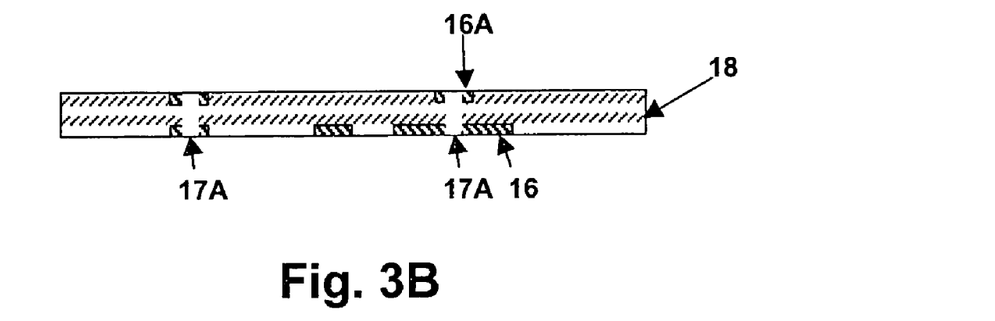
Figure 3C:
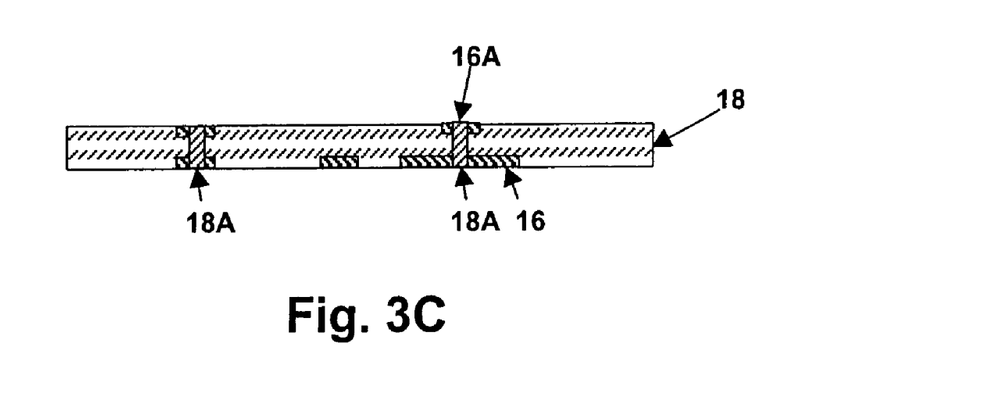

An alternative via-forming process is illustrated in FIGS. 3A-3C. As illustrated in FIG. 3A, metal layer 10A can be removed prior to the formation of via holes 17A as illustrated in FIG. 3B, and plating or paste-filling is then applied to form vias 18A as shown in FIG. 3C, with the only difference in resulting structure being the presence of via 18A material extending through circuit pattern 16A in contrast to the termination of vias 18 within dielectric layer 18 at or in the bottom side of circuit pattern 16A as shown in FIG. 2F.

Figure 4A:
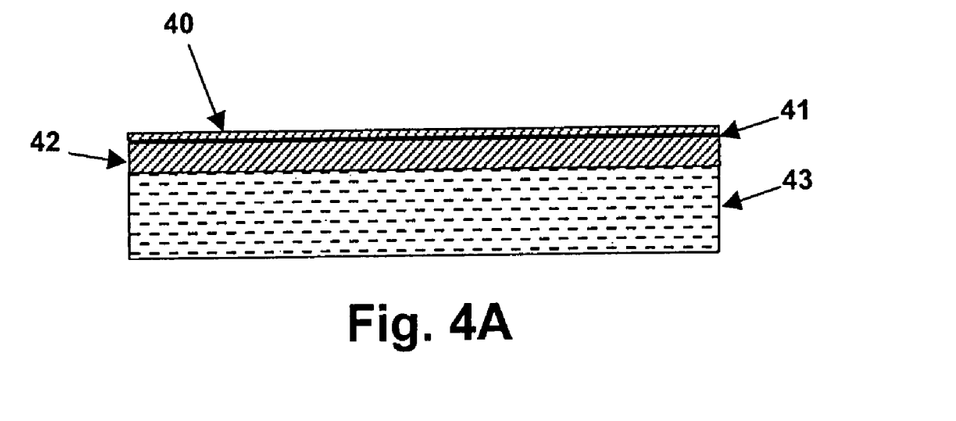
FIGS. 4A-4C are pictorial diagrams depicting cross-sectional views of various stages of preparation of a substrate in accordance with another embodiment of the present invention.
Figure 4B:
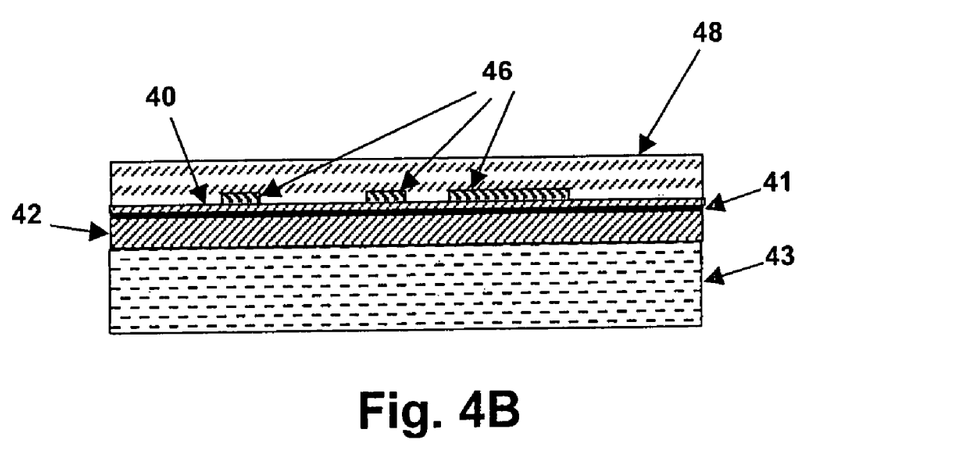
Figure 4C:
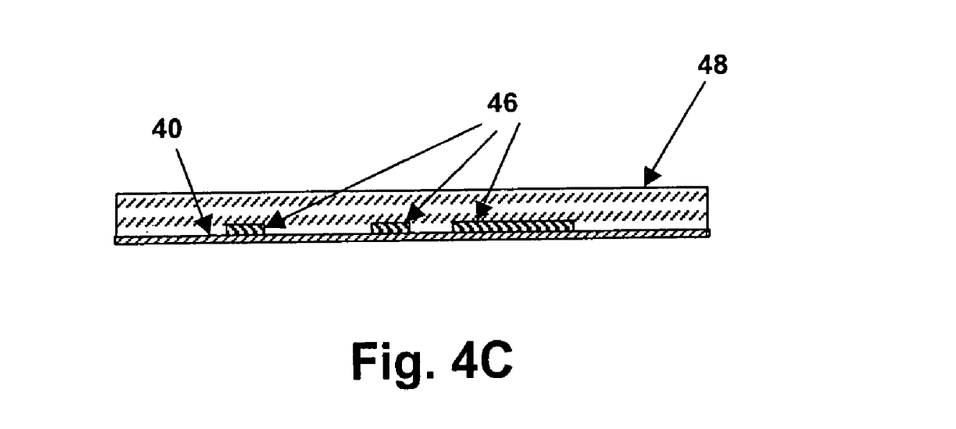

Referring now to FIGS. 4A-4C, various steps of an alternative process for making a semiconductor package substrate are depicted in accordance with an embodiment of the present invention. A laminated film such as the above-mentioned MICROTHIN laminate is provided as shown in FIG. 4A, which includes a very thin (3 micron) copper film 40 attached to a copper backing layer 42 by an organic releasing agent 41. The MICROTHIN laminate is temporarily laminated to a dielectric layer 43 in order to provide a backer for handling and processing.

It should be understood that in contrast to the method of the present invention, the typical use of the MICROTHIN product is to transfer a thin-film metal layer (film 40) to a dielectric for subsequent pattern formation by etching or for use in a semi-additive process where a circuit pattern is plated atop the thin metal film. In the present invention, the thin-film 40 is patterned with plated metal to form the circuit-on-foil structure first and then the circuit-on-foil structure is used to apply the circuit pattern within the dielectric. The temporary backing dielectric layer 43 is bonded to the copper backing layer 42 to provide even more support and backing rather than laminating film 40 onto a dielectric layer as in the pattern-formation technique mentioned above.

FIG. 4B shows the substrate after bonding of a dielectric layer 48 to the circuit-on-foil layer that includes circuit pattern 46 and copper film 40 (still attached to copper backing layer 42 by releasing agent 41, which is still laminated to dielectric layer 43). The formation of circuit pattern 46 and bonding of dielectric layer 48 are performed as described above with respect to FIGS. 1B-1F, with the only difference being the substitution of the laminated film structure provided in FIG. 4A for the metal layer 10/tool plate 12 combination shown in FIG. 1A.

After the circuit-on-foil structure is bonded to dielectric layer 48, dielectric layer 43, copper backing layer 42 and releasing agent 41 are peeled off of the substrate, leaving the structure depicted in FIG. 4C, which is essentially the same structure depicted in FIG. 2A, and can be processed by the following steps described above for FIGS. 2B-2C to form a dual-layer structure and the steps described for FIGS. 2D-2F or 3A-3C to form vias.

Figure 5A:
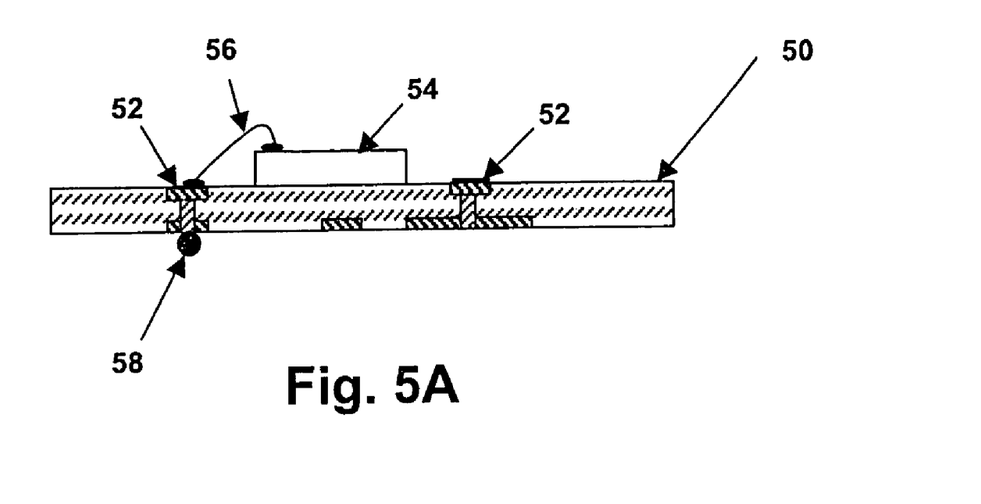
FIGS. 5A and 5B are pictorial diagrams depicting semiconductor packages in accordance with embodiments of the present invention.

Referring now to FIG. 5A, a semiconductor package in accordance with an embodiment of the present invention is depicted. A semiconductor die 54 is attached to substrate 50 using a bonding agent such as epoxy. While die 54 is depicted as mounted above substrate 50, a die mounting recess may also be laser-ablated or otherwise provided in substrate 50, reducing the package height. Electrical interconnects from die 54 are wire bonded with wires 56 to plated areas 52 atop the circuit pattern formed in substrate 50, electrically connecting die 54 to circuit patterns 16 and vias 18. External terminals 58, depicted as solder balls, are attached to circuit pattern 16A, which may be plated or unplated, providing a complete semiconductor package that may be encapsulated.

Figure 5B:
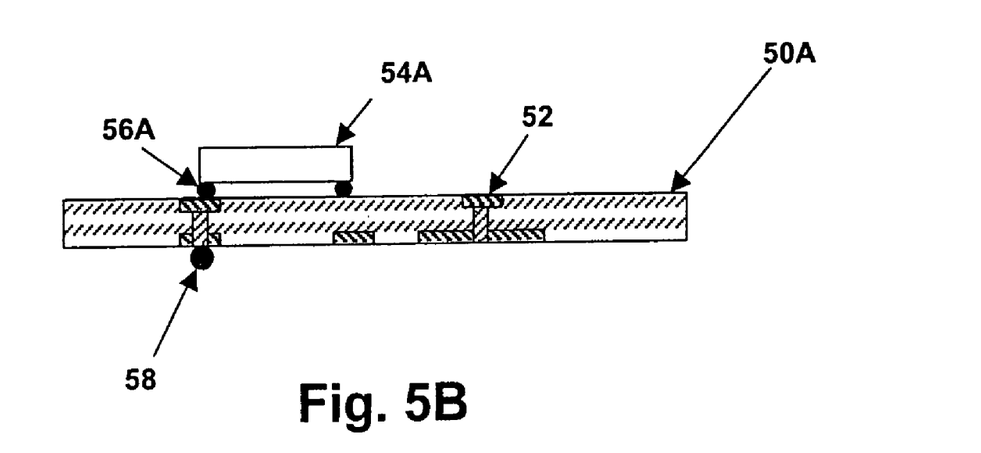

Referring now to FIG. 5B, a semiconductor package in accordance with an alternative embodiment of the invention is depicted. Die 54A is a "flip-chip" die that is directly bonded to a substrate 50A via solder balls 56A. External solder ball terminals 58 are provided as in the embodiment of FIG. 5A. Substrate 50A is fabricated in the same manner as substrate 50, but may have a differing configuration to support the flip-chip die 54A interconnect.

The above description of embodiments of the invention is intended to be illustrative and not limiting. Other embodiments of this invention will be obvious to those skilled in the art in view of the above disclosure and fall within the scope of the present invention.

What is claimed is:

1. A method of making a substrate for a semiconductor package, the method comprising:
providing a laminated layer structure comprising:
a backing layer; and
a metal layer attached to the backing layer;
plating a circuit layer atop a first surface of the metal layer to form a circuit-on-metal structure;
coupling the circuit-on-metal structure to a dielectric layer comprising causing the dielectric layer to flow around the circuit layer to the first surface of the metal layer so that the circuit layer is embedded within the dielectric layer and the first surface of the metal layer is in direct contact with a first surface of the dielectric layer;
removing the backing layer completely subsequent to the coupling the circuit-on-metal structure to a dielectric layer; and
removing the metal layer completely subsequent to the removing the backing layer.

2. The method of claim 1 wherein the laminated layer structure further comprises:
an organic releasing layer laminating the metal layer to the backing layer,
wherein the removing the backing layer comprises peeling the backing layer from the metal layer.

3. The method of claim 2, further comprising prior to the plating:
applying a plating resist material to the first surface of the metal layer; and
laser-ablating the plating resist material to form a plating resist structure defining voids in a shape of the circuit layer.

4. The method of claim 2, further comprising prior to the plating:
applying a photosensitive plating resist material to the first surface of the metal layer;
exposing the photosensitive plating resist material; and
removing regions of the photosensitive plating resist material to form a plating resist structure defining voids in a shape of the circuit layer.

5. The method of claim 4, wherein the exposing is performed by directing a laser beam along a surface of the photosensitive plating resist material to expose the photosensitive plating resist material.

6. The method of claim 2, wherein the metal layer has a thickness less than or equal to five microns.

7. The method of claim 2, wherein the metal layer has a thickness substantially equal to three microns.

8. The method of claim 2, wherein the backing layer is attached to a backing dielectric layer.

9. The method of claim 8, wherein the removing the backing layer further comprises:
removing the backing dielectric layer, the backing layer and the organic releasing layer from the metal layer.

10. The method of claim 8 wherein the peeling the backing layer from the metal layer further comprises peeling the backing dielectric layer and the organic releasing layer from the metal layer.

11. The method of claim 2, wherein the backing layer comprises copper.

12. The method of claim 1 wherein the metal layer is a first metal layer, the circuit layer is a first circuit layer, and the circuit-on-metal structure is a first circuit-on-metal structure, the method further comprising:
providing a second metal layer;

plating a second circuit layer atop a first surface of the second metal layer to form a second circuit-on-metal structure; and bonding the second circuit-on-metal structure to a second surface of the dielectric layer so that the second circuit layer is embedded within the dielectric layer and the first surface of the second metal layer is in contact with the second surface of the dielectric layer.

13. The method of claim 12 wherein the second circuit-on-metal structure is bonded to the second surface of the dielectric layer subsequent to the coupling the circuit-on-metal structure to a dielectric layer.

14. The method of claim 12, wherein the removing the metal layer is performed by etching.

15. The method of claim 12, wherein the removing the metal layer is performed by machining.

16. The method of claim 12, wherein the providing a laminated layer structure comprises providing the first metal layer attached to the backing layer by an organic releasing layer.

17. The method of claim 16, wherein the backing layer is attached to a backing dielectric layer, wherein the removing the backing layer comprises:

removing the backing dielectric layer, the backing layer and the organic releasing layer from the first metal layer.

18. The method of claim 1 further comprising:

applying a resist material to the first surface of the metal layer;

patterning the resist material to form a patterned resist material defining circuit pattern regions, wherein the plating comprises plating the circuit layer within the circuit pattern regions atop the first surface of the metal layer;

removing the patterned resist material, wherein the removing the metal layer comprises etch removing the metal layer.

19. The method of claim 18 wherein the patterning the resist material comprises laser-ablating the resist material.

20. The method of claim 18 wherein the resist material comprises a photosensitive resist material, the patterning the resist material comprising:

exposing the photosensitive resist material; and
removing regions of the photosensitive resist material.

21. The method of claim 20, wherein the exposing is performed by directing a laser beam along a surface of the photosensitive resist material.

22. The method of claim 1 wherein the laminated layer structure is a first laminated layer structure, the backing layer is a first backing layer, the metal layer is a first metal layer, the circuit layer is a first circuit layer, and the circuit-on-metal structure is a first circuit-on-metal structure, the method further comprising:

providing a second laminated layer structure comprising:
a second backing layer; and
a second metal layer attached to the second backing layer;

plating a second circuit layer atop a first surface of the second metal layer to form a second circuit-on-metal structure;

coupling the second circuit-on-metal structure to the dielectric layer so that the second circuit layer is embedded within the dielectric layer and the first surface of the second metal layer is in contact with a second surface of the dielectric layer;

removing the second backing layer; and
removing the second metal layer.

23. The method of claim 22 further comprising electrically connecting the first circuit layer to the second circuit layer through the dielectric layer.

24. The method of claim 22 further comprising:

forming via holes in the dielectric layer between the first circuit layer and the second circuit layer; and filling the via holes with an electrically conductive material to form vias electrically connecting the first circuit layer to the second circuit layer.

25. The method of claim 24 wherein the via holes are formed by mechanical drilling.

26. The method of claim 24 wherein the via holes extend through the first circuit layer to a bottom side of the second circuit layer.

27. The method of claim 24 wherein the via holes extend though the first circuit layer and the second circuit layer.

28. The method of claim 22 wherein the second circuit-on-metal structure is coupled to the second surface of the dielectric layer subsequent to the coupling of the first circuit-on-metal structure to the first surface of the dielectric layer.

29. The method of claim 1 further comprising forming plated areas on the first circuit layer.

30. The method of claim 1 further comprising forming plated areas on the second circuit layer.

31. The method of claim 1 further comprising forming plated areas on the first and second circuit layers.

32. The method of claim 2 wherein the laminated layer structure is a first laminated layer structure, the backing layer is a first backing layer, the organic releasing layer is a first organic releasing layer, the metal layer is a first metal layer, the circuit layer is a first circuit layer, and the circuit-on-metal structure is a first circuit-on-metal structure, the method further comprising:

providing a second laminated layer structure comprising:
a second backing layer;
a second organic releasing layer; and
a second metal layer laminated to the second backing layer by the second organic releasing layer;

plating a second circuit layer atop a first surface of the second metal layer to form a second circuit-on-metal structure;

bonding the second circuit-on-metal structure to the dielectric layer so that the second circuit layer is embedded within the dielectric layer and the first surface of the second metal layer is in contact with a second surface of the dielectric layer;

releasing the second metal layer from the second backing layer by peeling the second backing layer from the second metal layer; and removing the second metal layer.

33. The method of claim 32 wherein the second circuit-on-metal structure is bonded to the second surface of the dielectric layer subsequent to the bonding of the first circuit-on-metal structure to the first surface of the dielectric layer.

* * * * *

UNITED STATES PATENT AND TRADEMARK OFFICE
CERTIFICATE OF CORRECTION

PATENT NO. : 8,322,030 B1  
APPLICATION NO. : 11/982637  
DATED : December 4, 2012  
INVENTOR(S) : Ronald Patrick Huemoeller and Sukianto Rusli It is certified that error appears in the above-identified patent and that said Letters Patent is hereby corrected as shown below:

On the Title Page, on the last line of Item (63), replace "now abandoned." with --now abandoned, which is a continuation-in-part of application No. 10/138,225, filed on May 1, 2002, now Pat. No. 6,930,256.--

Signed and Sealed this
Fourteenth Day of May, 2013

Teresa Stanek Rea
*Acting Director of the United States Patent and Trademark Office*